US012641976B2

(12) United States Patent
Saitoh et al.

(10) Patent No.: US 12,641,976 B2
(45) Date of Patent: May 26, 2026

(54) DISPLAY DEVICE TEST PORTION AND PRODUCTION METHOD FOR SAME

(71) Applicant: Sharp Display Technology Corporation, Kameyama City (JP)

(72) Inventors: Takao Saitoh, Kameyama City (JP); Yohsuke Kanzaki, Kameyama City (JP); Masaki Yamanaka, Kameyama City (JP); Masahiko Miwa, Kameyama City (JP); Yi Sun, Kameyama City (JP); Masaki Fujiwara, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 457 days.

(21) Appl. No.: 18/281,393

(22) PCT Filed: Mar. 25, 2021

(86) PCT No.: PCT/JP2021/012669
§ 371 (c)(1),
(2) Date: Sep. 11, 2023

(87) PCT Pub. No.: WO2022/201461
PCT Pub. Date: Sep. 29, 2022

(65) Prior Publication Data
US 2024/0155901 A1     May 9, 2024

(51) Int. Cl.
*H10K 59/131*     (2023.01)
*H10K 59/12*     (2023.01)
*H10K 71/40*     (2023.01)
*H10K 71/70*     (2023.01)

(52) U.S. Cl.
CPC ..... *H10K 59/1315* (2023.02); *H10K 59/1201* (2023.02); *H10K 71/40* (2023.02); *H10K 71/70* (2023.02)

(58) Field of Classification Search
CPC ........... H10K 59/1315; H10K 59/1201; H10K 71/70; H10K 71/40
USPC .......................... 257/40, 59, 88, 91, 99, 100
See application file for complete search history.

(56) References Cited

U.S. PATENT DOCUMENTS 9,722,002 B2 *   8/2017   Kim ....................... H10K 59/88
9,997,635 B2 *   6/2018   Shi ....................... H10D 30/6743
11,088,138 B2 *   8/2021   Lee ....................... H10D 62/235
11,626,465 B2 *   4/2023   Lee .................... H10K 59/1213
                                                                257/40

(Continued)

FOREIGN PATENT DOCUMENTS

JP          2007-013125 A        1/2007

*Primary Examiner* — Eric W Jones
(74) *Attorney, Agent, or Firm* — ScienBiziP, P.C.

(57) ABSTRACT

A second test portion includes a second test first terminal, a second test second terminal, a second test third terminal, and a second test fourth terminal electrically connected to a second test semiconductor layer via respective contact holes formed in a layered film of a gate insulating film and an interlayer insulating film, and the layered film of the gate insulating film and the interlayer insulating film in the second test portion is provided with an opening open upward between at least one of the second test first terminal, the second test second terminal, the second test third terminal, and the second test fourth terminal.

13 Claims, 12 Drawing Sheets

(56)         References Cited

U.S. PATENT DOCUMENTS

| 11,706,959 | B2 * | 7/2023 | Kim | H10K 59/131 |
| | | | | 257/40 |
| 11,730,028 | B2 * | 8/2023 | Cho | H10K 59/131 |
| | | | | 257/40 |
| 2006/0270073 | A1 | 11/2006 | Isobe | |
| 2008/0283836 | A1 * | 11/2008 | Lee | H10K 71/70 |
| | | | | 257/E33.001 |
| 2009/0250758 | A1 | 10/2009 | Isobe | |
| 2015/0162393 | A1 * | 6/2015 | Kang | H10K 10/482 |
| | | | | 438/23 |
| 2016/0240595 | A1 * | 8/2016 | Kim | H10K 59/35 |
| 2018/0061994 | A1 * | 3/2018 | Shi | H10D 86/40 |
| 2021/0257418 | A1 * | 8/2021 | Lee | H10K 59/122 |

* cited by examiner

DISPLAY DEVICE TEST PORTION AND PRODUCTION METHOD FOR SAME

TECHNICAL FIELD

The disclosure relates to a display device and a method for manufacturing the same.

BACKGROUND ART

In recent years, as a display device replacing a liquid crystal display device, a self-luminous organic electroluminescence (hereinafter also referred to as "EL") display device using an organic EL element has attracted attention. This organic EL display device includes, for example, a TFT layer in which each subpixel constituting a display region is provided with a thin film transistor (hereinafter also referred to as "TFT") for driving the organic EL element.

For example, as a test element group (hereinafter also referred to as "TEG") for evaluating characteristics of the TFT, PTL 1 discloses a semiconductor device provided with a semiconductor element having an Si region in which a part of an impurity region is not metal-silicified.

CITATION LIST

Patent Literature

PTL 1: JP 2007-13125 A

SUMMARY

Technical Problem

Unlike a liquid crystal display device that performs gradation display by voltage control, for the organic EL display device that performs gradation display by current control, there is demand for a TFT having a gentle sloping waveform of current-voltage characteristics (Id-Vg curve), that is, a large subthreshold coefficient (S value). However, the larger the S value of the TFT, the larger the variation in the S value. Therefore, even if an attempt is made to manage the characteristics of a TFT provided in a display region by, for example, providing a TEG in a frame region surrounding the display region, measuring the electrical resistance value of the TEG, and performing a process test, the reproducibility of the electrical resistance value of the TEG is so poor that it is difficult to manage the characteristics of the TFT by the process test.

The disclosure has been made in view of this, and an object of the disclosure is to reliably manage characteristics of a thin film transistor by a process test.

Solution to Problem

To achieve the above object, a display device according to the disclosure is a display device including: a base substrate; a thin film transistor layer provided on the base substrate and including a semiconductor layer, a gate insulating film, a first wiring line layer, an interlayer insulating film, and a second wiring line layer layered in this order; and a light-emitting element layer provided on the thin film transistor layer and including a plurality of light-emitting elements arrayed corresponding to a plurality of subpixels constituting a display region, in which a frame region is provided around the display region, a test portion is provided in the frame region, the test portion includes a first test portion and a second test portion provided adjacent to each other, the first test portion includes a first test semiconductor layer formed of a same material as a material of the semiconductor layer in a same layer, the gate insulating film and the interlayer insulating film provided covering the first test semiconductor layer, and a first test first terminal, a first test second terminal, a first test third terminal, and a first test fourth terminal provided on the interlayer insulating film and electrically connected to the first test semiconductor layer via respective contact holes formed in a layered film of the gate insulating film and the interlayer insulating film, the second test portion includes a second test semiconductor layer formed of a same material as a material of the semiconductor layer in a same layer, the gate insulating film and the interlayer insulating film provided covering the second test semiconductor layer, and a second test first terminal, a second test second terminal, a second test third terminal, and a second test fourth terminal provided on the interlayer insulating film and electrically connected to the second test semiconductor layer via respective contact holes formed in a layered film of the gate insulating film and the interlayer insulating film, and the layered film of the gate insulating film and the interlayer insulating film in the second test portion is provided with an opening open upward between at least one of the second test first terminal, the second test second terminal, the second test third terminal, and the second test fourth terminal.

Advantageous Effects of Disclosure

According to the disclosure, it is possible to reliably manage characteristics of a thin film transistor by a process test.

DESCRIPTION OF EMBODIMENTS

Embodiments of a technique according to the disclosure will be described below in detail with reference to the drawings. Note that the technique according to the disclosure is not limited to the embodiments to be described below.

First Embodiment

Figure 1:
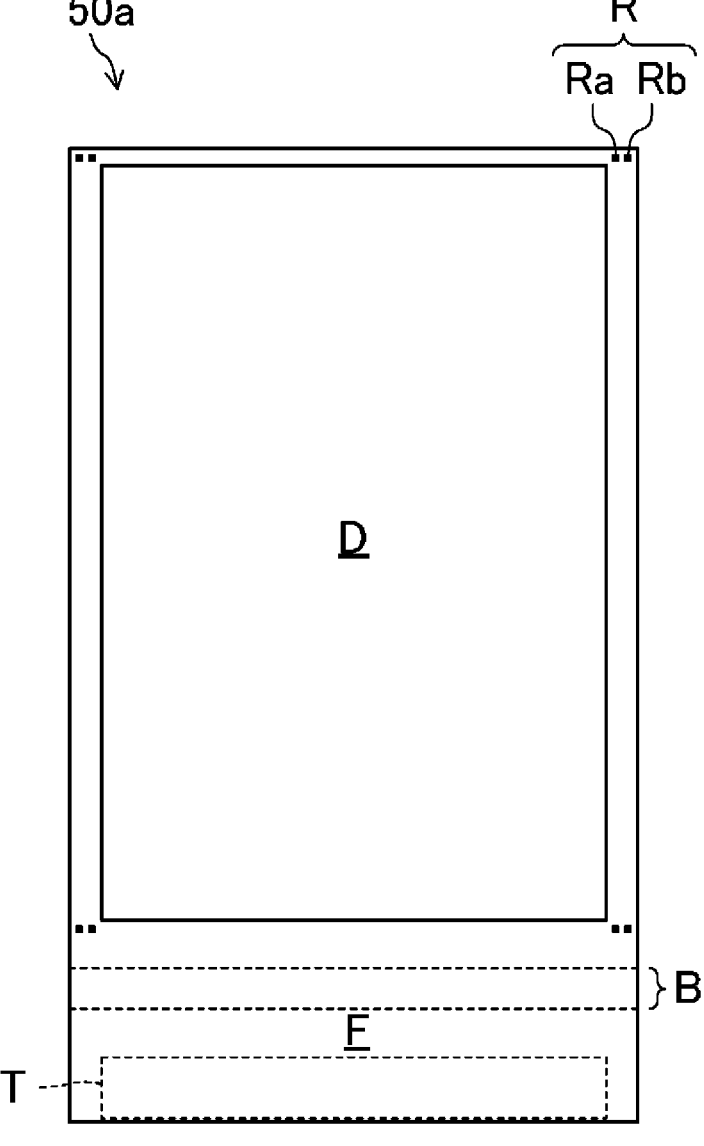
FIG. 1 is a plan view illustrating a schematic configuration of an organic EL display device according to a first embodiment of the disclosure.
Figure 2:
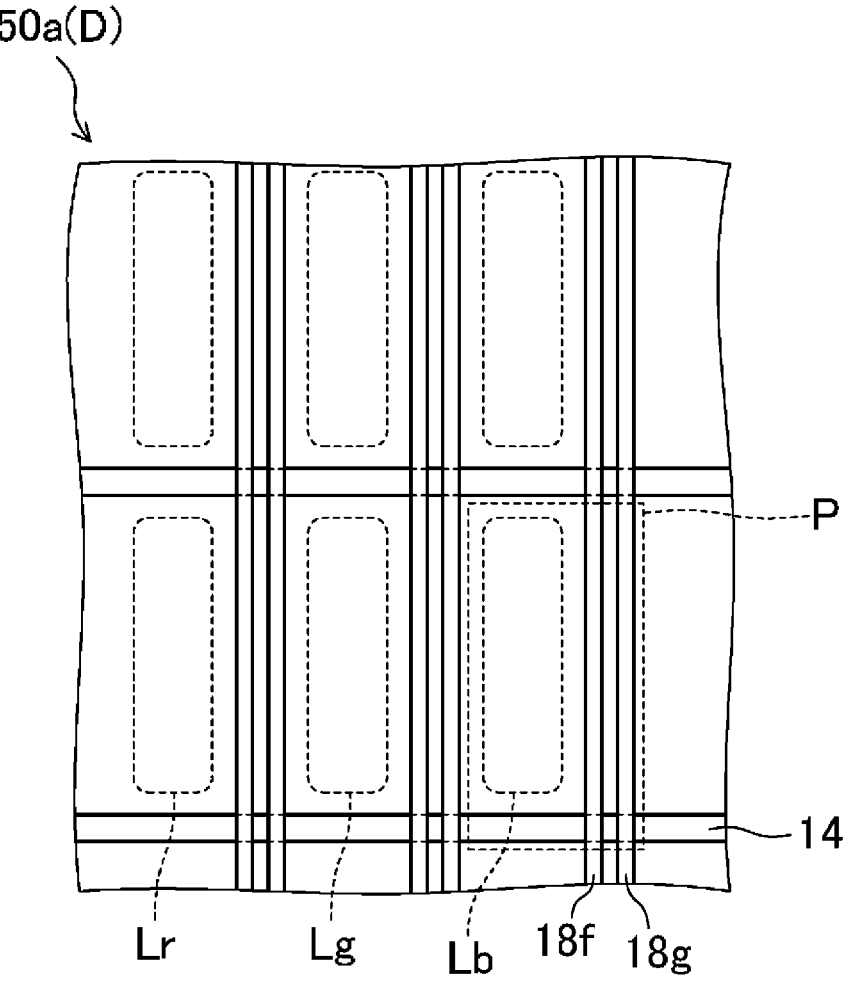
FIG. 2 is a plan view of a display region of the organic EL display device according to the first embodiment of the disclosure.
Figure 3:
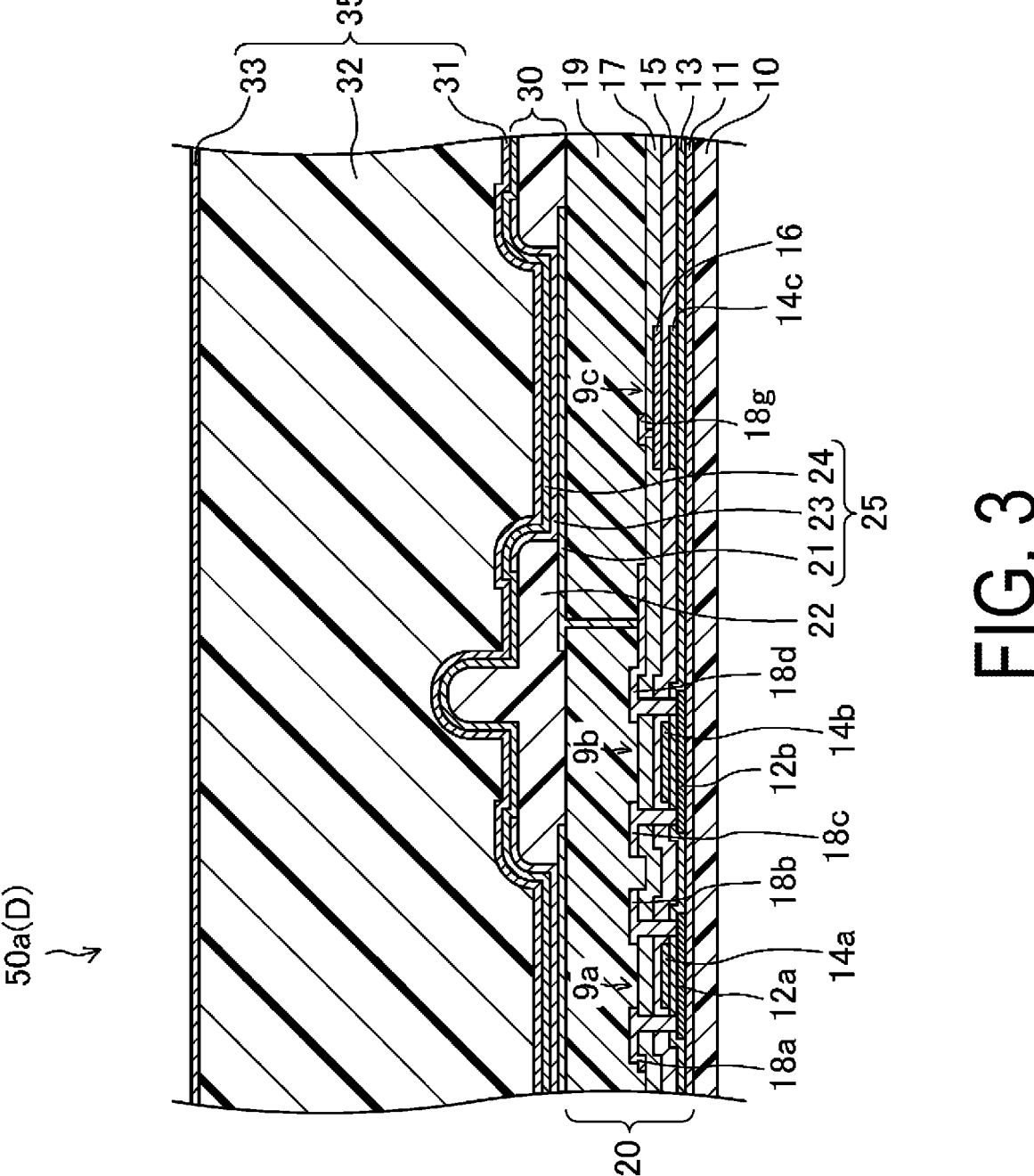
FIG. 3 is a cross-sectional view of the display region of the organic EL display device according to the first embodiment of the disclosure.
Figure 4:
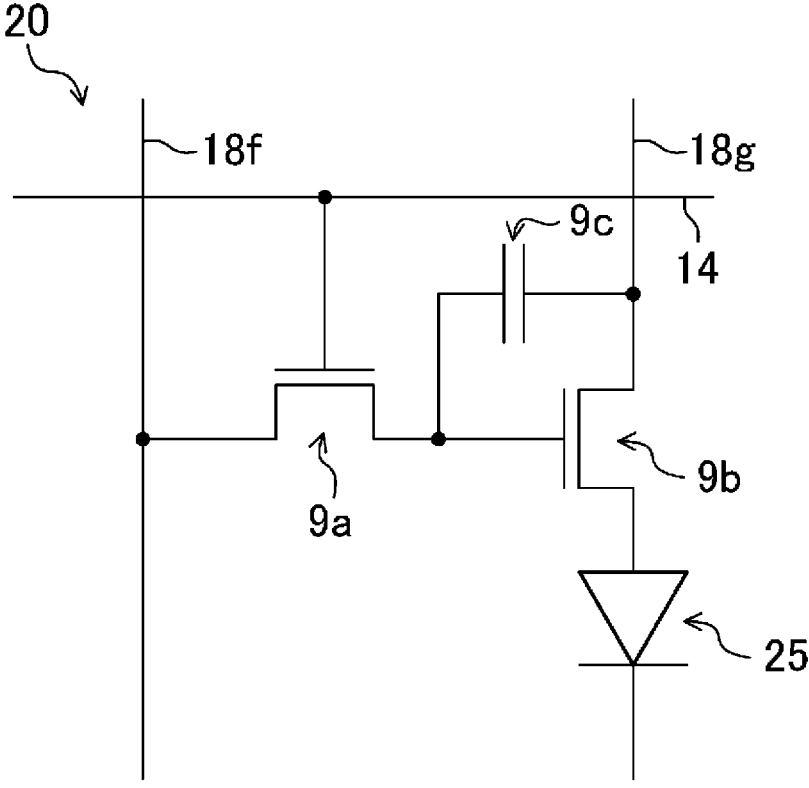
FIG. 4 is an equivalent circuit diagram of a TFT layer constituting the organic EL display device according to the first embodiment of the disclosure.
Figure 5:
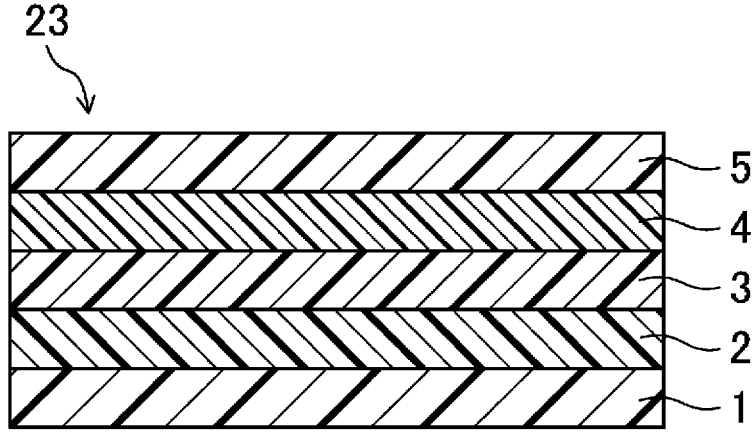
FIG. 5 is a cross-sectional view illustrating an organic EL layer constituting the organic EL display device according to the first embodiment of the disclosure.
Figure 6:
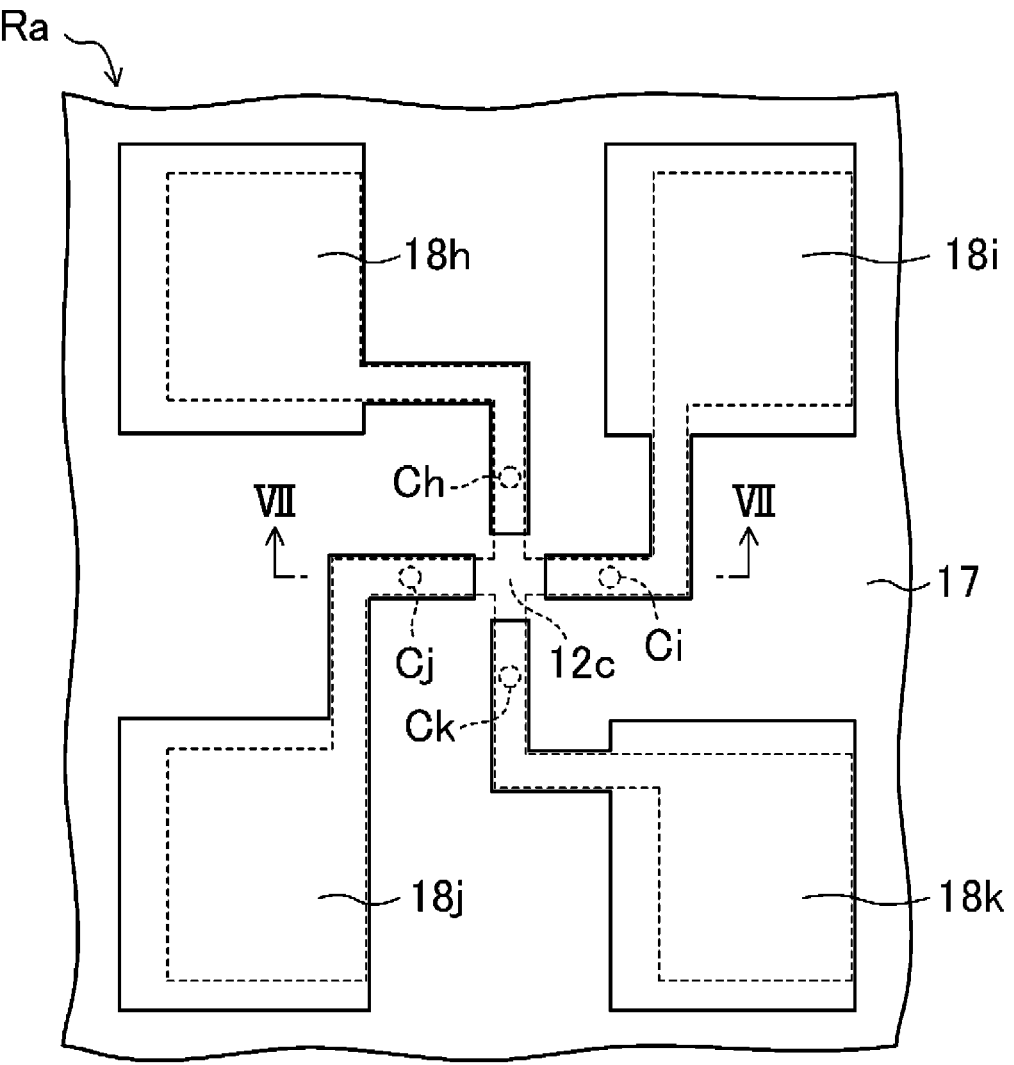
FIG. 6 is a plan view of a first test portion constituting the organic EL display device according to the first embodiment of the disclosure.
Figure 7:
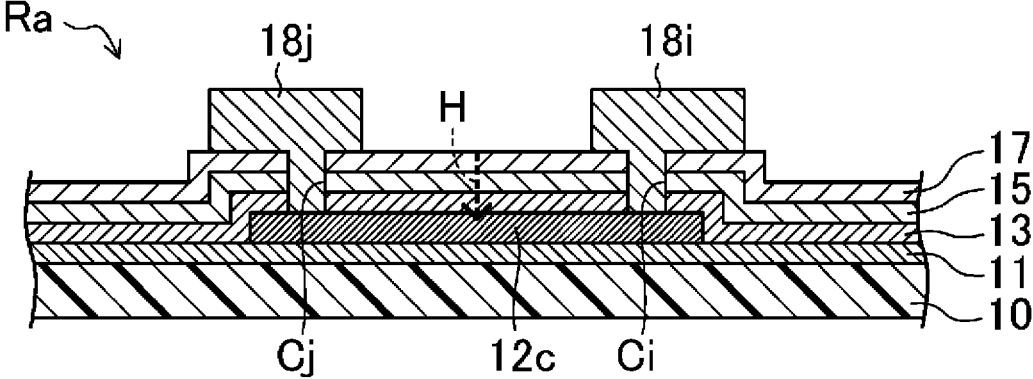
FIG. 7 is a cross-sectional view of the first test portion taken along line VII-VII in FIG. 6.
Figure 8:
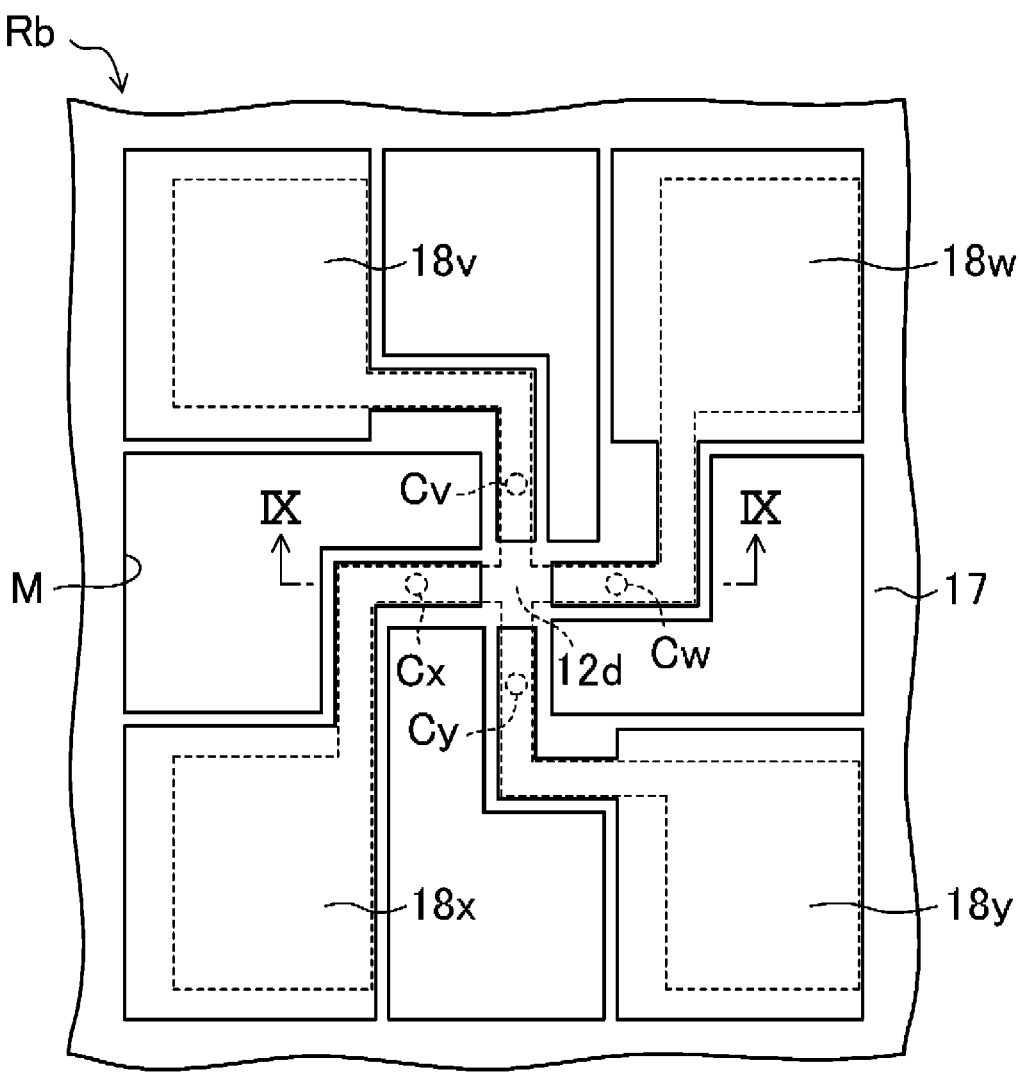
FIG. 8 is a plan view of a second test portion constituting the organic EL display device according to the first embodiment of the disclosure.
Figure 9:
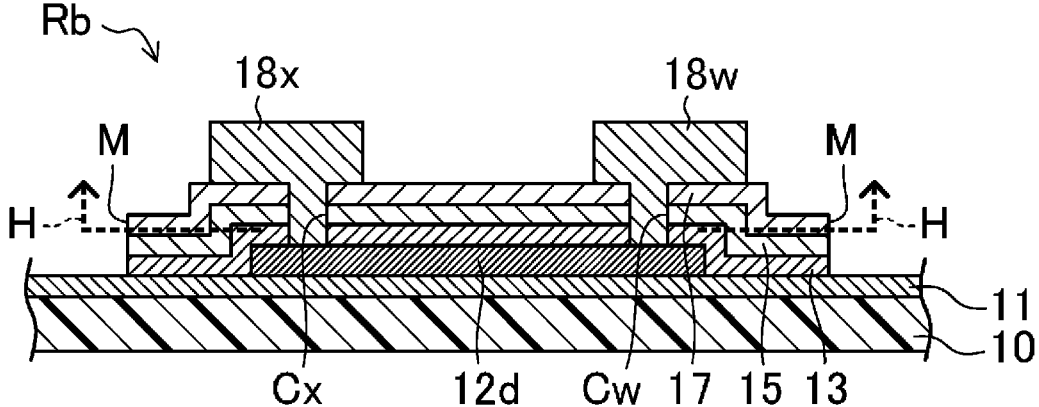
FIG. 9 is a cross-sectional view of the second test portion taken along line IX-IX in FIG. 8.
Figure 10:
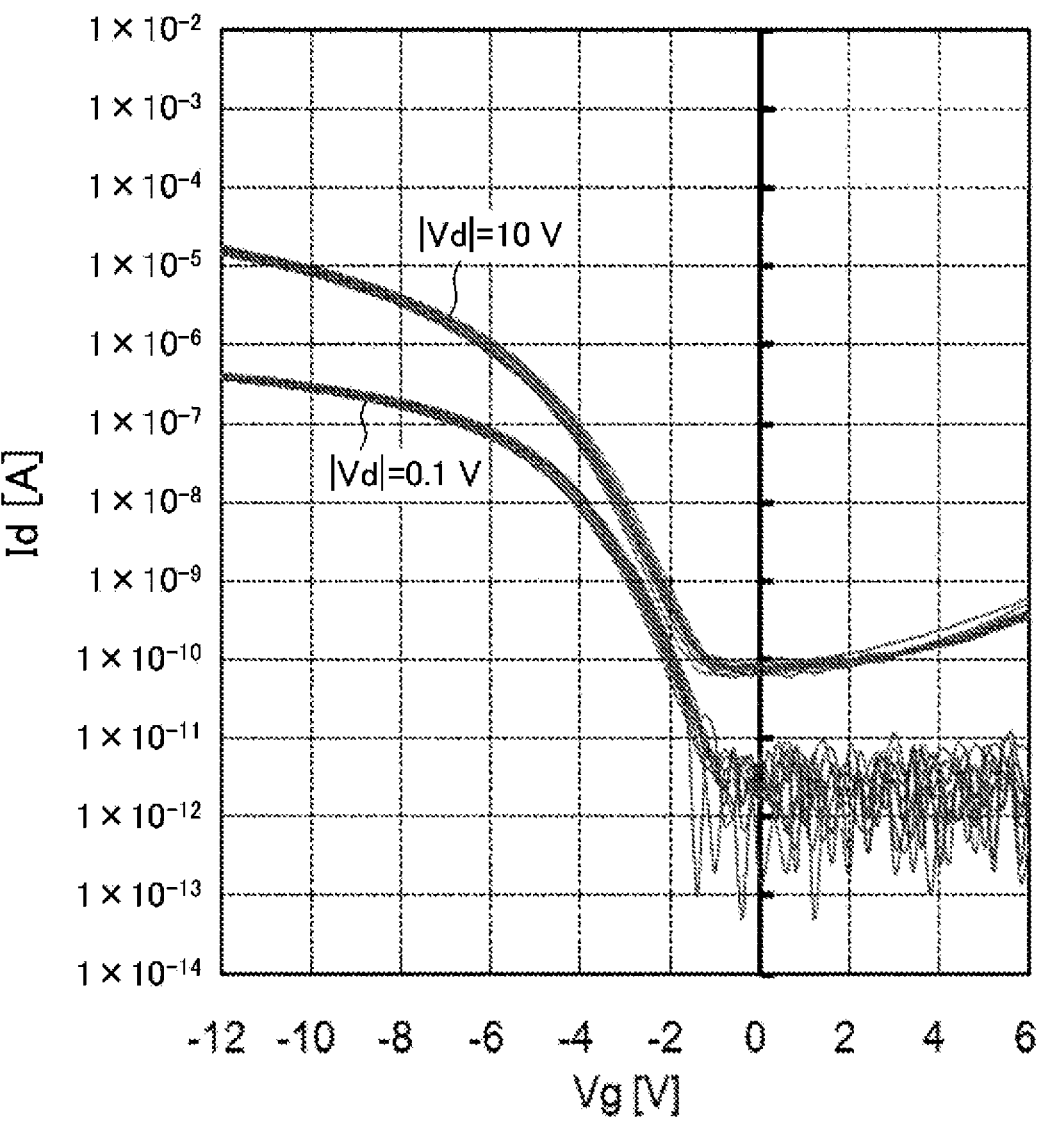
FIG. 10 is a graph showing waveforms of current-voltage characteristics in an example of the organic EL display device according to the first embodiment of the disclosure.
Figure 11:
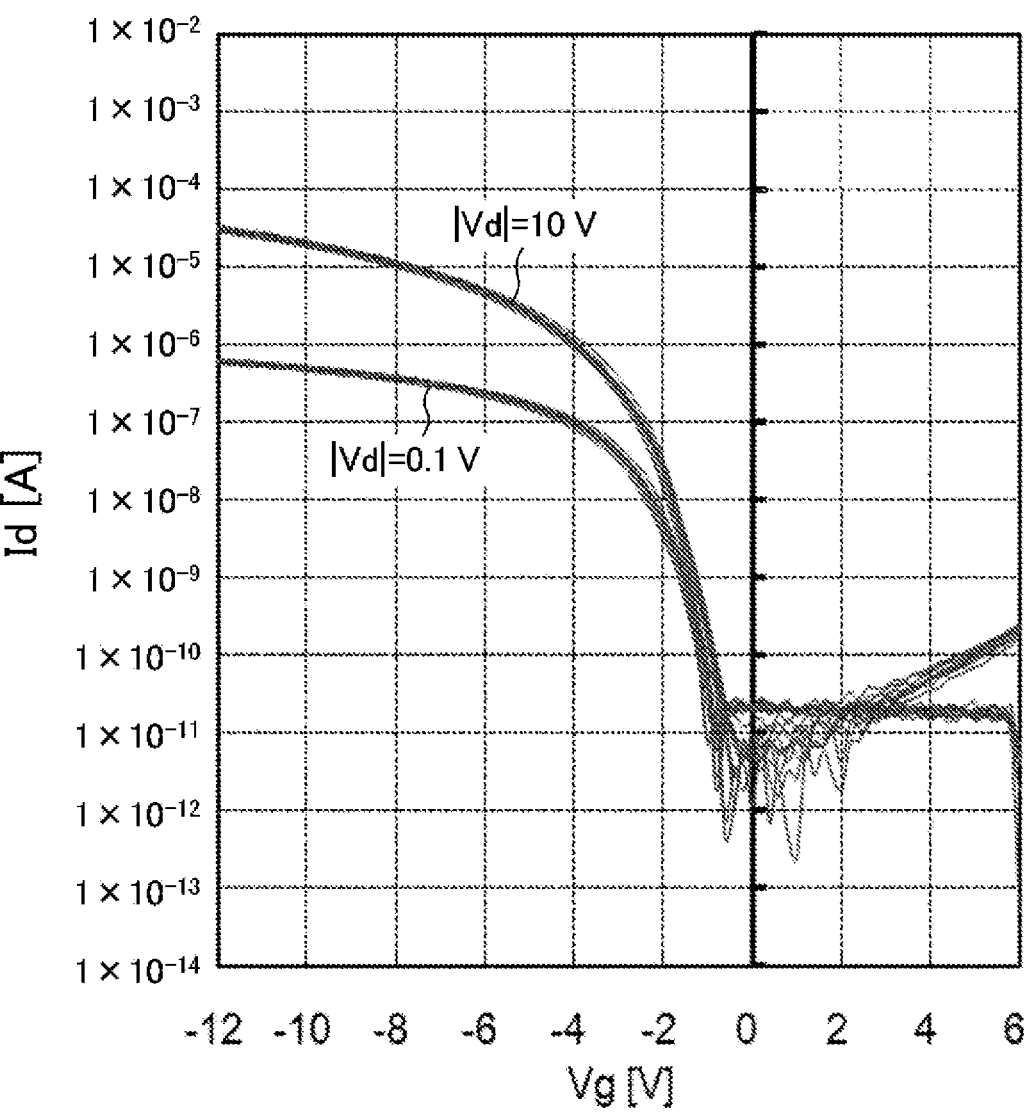
FIG. 11 is a graph showing waveforms of current-voltage characteristics in a comparative example of the organic EL display device according to the first embodiment of the disclosure.

FIGS. 1 to 11 illustrate a first embodiment of a display device and a method for manufacturing the same according to the disclosure. Note that, in each of the following embodiments, an organic EL display device including an organic EL element will be exemplified as a display device including a light-emitting element. Here, FIG. 1 is a plan view illustrating a schematic configuration of an organic EL display device 50a according to the present embodiment. FIGS. 2 and 3 are a plan view and a cross-sectional view, respectively, of a display region D in the organic EL display device 50a. FIG. 4 is an equivalent circuit diagram of a TFT layer 20 constituting the organic EL display device 50a. FIG. 5 is a cross-sectional view illustrating an organic EL layer 23 constituting the organic EL display device 50a. FIG. 6 is a plan view of a first test portion Ra constituting the organic EL display device 50a. FIG. 7 is a cross-sectional view of the first test portion Ra taken along line VII-VII in FIG. 6. FIG. 8 is a plan view of a second test portion Rb constituting the organic EL display device 50a. FIG. 9 is a cross-sectional view of the second test portion Rb taken along line IX-IX in FIG. 8. FIGS. 10 and 11 are graphs showing waveforms of current-voltage characteristics in an example and a comparative example of the organic EL display device 50a.

As illustrated in FIG. 1, the organic EL display device 50a includes, for example, the display region D that is provided in a rectangular shape and in which an image is displayed, and a frame region F provided in a frame-like shape surrounding the display region D. Note that in the present embodiment, the display region D having the rectangular shape is exemplified, but the rectangular shape includes a substantial rectangular shape such as a shape whose sides are arc-shaped, a shape having arc-shaped corners, and a shape in which a part of a side has a notch.

As illustrated in FIG. 2, a plurality of subpixels P are arrayed in a matrix shape in the display region D. In addition, in the display region D, for example, a subpixel P including a red light-emitting region Lr for displaying a red color, a subpixel P including a green light-emitting region Lg for displaying a green color, and a subpixel P including a blue light-emitting region Lb for displaying a blue color are provided adjacent to one another, as illustrated in FIG. 2. Note that one pixel is configured by, for example, three adjacent subpixels P including the red light-emitting region Lr, the green light-emitting region Lg, and the blue light-emitting region Lb in the display region D.

A lower end portion of the frame region F in FIG. 1 is provided with a terminal portion T in which a plurality of terminals are arrayed. In the frame region F, a bending portion B that can be bent at 180° (in a U shape) with the lateral direction in FIG. 1 as a bending axis is provided extending in one direction (lateral direction in the figure) between the display region D and the terminal portion T. In the frame region F, as illustrated in FIG. 1, parts corresponding to four corners of the display region D are provided with respective test portions R. Here, as illustrated in FIG. 1, the test portion R includes, for example, the first test portion Ra and the second test portion Rb provided, as TEGs, adjacent to each other at an interval of about 0.5 mm. Note that specific configurations of the first test portion Ra and the second test portion Rb will be described later.

As illustrated in FIG. 3, the organic EL display device 50a includes a resin substrate layer 10 provided as a base substrate, the TFT layer 20 provided on the resin substrate layer 10, an organic EL element layer 30 provided as a light-emitting element layer on the TFT layer 20, and a sealing film 35 provided on the organic EL element layer 30.

The resin substrate layer 10 is formed, for example, of a polyimide resin.

As illustrated in FIG. 3, the TFT layer 20 includes a base coat film 11 provided on the resin substrate layer 10, a plurality of first TFTs 9a, a plurality of second TFTs 9b, and a plurality of capacitors 9c provided on the base coat film 11, and a flattening film 19 provided on each of the first TFTs 9a, each of the second TFTs 9b, and each of the capacitors 9c. Here, on the TFT layer 20, as illustrated in FIG. 3, the base coat film 11, semiconductor layers 12a and 12b, a gate insulating film 13, a first wiring line layer such as a gate line 14 (see FIG. 2), gate electrodes 14a and 14b, and a lower conductive layer 14c, a first interlayer insulating film 15, an upper conductive layer 16, a second interlayer insulating film 17, a second wiring line layer such as a source line 18f (see FIG. 2), source electrodes 18a and 18c, drain electrodes 18b and 18d, and a power source line 18g, and the flattening film 19 are layered in this order on the resin substrate layer 10. In addition, on the TFT layer 20, as illustrated in FIGS. 2 and 4, a plurality of the gate lines 14 are provided extending in parallel to one another in the lateral direction in the figures. In addition, on the TFT layer 20, as illustrated in FIGS. 2 and 4, a plurality of the source lines 18f are provided extending in parallel to one another in the longitudinal direction in the figures. In addition, on the TFT layer 20, as illustrated in FIGS. 2 and 4, a plurality of the power source lines 18g are provided extending in parallel to one another in the longitudinal direction in the figures. Note that, as illustrated in FIG. 2, each of the power source lines 18g is provided so as to be adjacent to a corresponding one of the source lines 18f. In the TFT layer 20, as illustrated in FIG. 4, each of the subpixels P is provided with the first TFT 9a, the second TFT 9b, and the capacitor 9c.

For example, each of the base coat film 11, the gate insulating film 13, the first interlayer insulating film 15, and the second interlayer insulating film 17 is composed of a single-layer film or a layered film of an inorganic insulating film of silicon nitride, silicon oxide, silicon oxynitride, or the like.

The first TFT 9a and the second TFT 9b are p-type TFTs in which the semiconductor layers 12a and 12b (described later) are doped with a dopant such as boron, for example.

The first TFT 9a is electrically connected to the corresponding gate line 14 and source line 18f in each of the subpixels P, as illustrated in FIG. 4. Additionally, as illustrated in FIG. 3, the first TFT 9a includes the semiconductor layer 12a, the gate insulating film 13, the gate electrode 14a, the first interlayer insulating film 15, the second interlayer insulating film 17, and the source electrode 18a and the drain electrode 18b, which are provided in this order on the base coat film 11. Here, as illustrated in FIG. 3, the semiconductor layer 12a is provided in an island shape on the base coat film 11, and has, for example, a channel region, a source region, and a drain region. Additionally, as illustrated in FIG. 3, the gate insulating film 13 is provided so as to cover the semiconductor layer 12a. Additionally, as illustrated in FIG. 3, the gate electrode 14a is provided on the gate insulating film 13 such that the gate electrode 14a overlaps with the channel region of the semiconductor layer 12a. Additionally, as illustrated in FIG. 3, the first interlayer insulating film 15 and the second interlayer insulating film 17 are sequentially provided so as to cover the gate electrode 14a. Additionally, as illustrated in FIG. 3, the source electrode 18a and the drain electrode 18b are separated from each other on the second interlayer insulating film 17. Additionally, as illustrated in FIG. 3, the source electrode 18a and the drain electrode 18b are electrically connected to the source region and the drain region of the semiconductor layer 12a, respectively, via each contact hole formed in a layered film including the gate insulating film 13, the first interlayer insulating film 15, and the second interlayer insulating film 17.

The second TFT 9b is electrically connected to the corresponding first TFT 9a and power source line 18g in each of the subpixels P, as illustrated in FIG. 4. As illustrated in FIG. 3, the second TFT 9b includes the semiconductor layer 12b, the gate insulating film 13, the gate electrode 14b, the first interlayer insulating film 15, the second interlayer insulating film 17, and the source electrode 18c and the drain electrode 18d, which are provided in this order on the base coat film 11. Here, as illustrated in FIG. 3, the semiconductor layer 12b is provided in an island shape on the base coat film 11 and has, for example, a channel region, a source region, and a drain region. Additionally, as illustrated in FIG. 3, the gate insulating film 13 is provided to cover the semiconductor layer 12b. Additionally, as illustrated in FIG. 3, the gate electrode 14b is provided on the gate insulating film 13 such that the gate electrode 14b overlaps with the channel region of the semiconductor layer 12b. Additionally, as illustrated in FIG. 3, the first interlayer insulating film 15 and the second interlayer insulating film 17 are provided in this order to cover the gate electrode 14b. Additionally, as illustrated in FIG. 3, the source electrode 18c and the drain electrode 18d are separated from each other on the second interlayer insulating film 17. Additionally, as illustrated in FIG. 3, the source electrode 18c and the drain electrode 18d are electrically connected to the source region and the drain region of the semiconductor layer 12b, respectively, via each contact hole formed in a layered film including the gate insulating film 13, the first interlayer insulating film 15, and the second interlayer insulating film 17.

Note that in the present embodiment, the first TFT 9a and the second TFT 9b are exemplified as being of a top-gate type TFT, but the first TFT 9a and the second TFT 9b may be a bottom-gate type TFT.

The capacitor 9c is electrically connected to the corresponding first TFT 9a and power source line 18g in each of the subpixels P, as illustrated in FIG. 4. Here, as illustrated in FIG. 3, the capacitor 9c includes the lower conductive layer 14c, the first interlayer insulating film 15 provided to cover the lower conductive layer 14c, and the upper conductive layer 16 provided on the first interlayer insulating film 15 to overlap the lower conductive layer 14c. Note that, as illustrated in FIG. 3, the upper conductive layer 16 is electrically connected to the power source line 18g via a contact hole formed in the second interlayer insulating film 17.

The flattening film 19 has a flat surface in the display region D, and is formed of an organic resin material such as a polyimide resin, for example.

As illustrated in FIG. 3, the organic EL element layer 30 includes a plurality of organic EL elements 25 as a plurality of light-emitting elements arrayed in a matrix shape corresponding to the plurality of subpixels P.

As illustrated in FIG. 3, the organic EL element 25 includes a first electrode 21 provided on the flattening film 19 in each of the subpixels P, the organic EL layer 23 provided in each of the subpixels P on the first electrode 21, and a second electrode 24 provided on the organic EL layer 23 commonly to the plurality of subpixels P.

As illustrated in FIG. 3, the first electrode 21 is electrically connected to the drain electrode 18d of the second TFT 9b of each of the subpixels P via a contact hole formed in the flattening film 19. In addition, the first electrode 21 has a function of injecting holes (positive holes) into the organic EL layer 23. In addition, the first electrode 21 is preferably formed of a material with a high work function to improve the efficiency of hole injection into the organic EL layer 23. Here, examples of a material constituting the first electrode 21 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of the material constituting the first electrode 21 may include alloys such as astatine (At)/astatine oxide ($AtO_2$). Furthermore, the material constituting the first electrode 21 may be an electrically conductive oxide, for example, tin oxide (SnO), zinc oxide (ZnO), indium tin oxide (ITO), or indium zinc oxide (IZO). In addition, the first electrode 21 may be formed by layering a plurality of layers formed of any of the materials described above. Note that, examples of compound materials having a high work function include indium tin oxide (ITO) and indium zinc oxide (IZO). Furthermore, a peripheral end portion of the first electrode 21 is covered with an edge cover 22 provided in a lattice shape commonly to the plurality of subpixels P. Here, examples of a material constituting the edge cover 22 include a positive-working photosensitive resin such as a polyimide resin, an acrylic resin, a polysiloxane resin, and a novolac resin.

As illustrated in FIG. 5, the organic EL layer 23 includes a hole injection layer 1, a hole transport layer 2, a light-emitting layer 3, an electron transport layer 4, and an electron injection layer 5 that are sequentially provided on the first electrode 21.

The hole injection layer 1 is also referred to as an anode electrode buffer layer, and has a function of reducing an energy level difference between the first electrode 21 and the organic EL layer 23 to thereby improve the efficiency of hole injection into the organic EL layer 23 from the first electrode 21. Here, examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 has a function of improving the efficiency of hole transport from the first electrode 21 to the organic EL layer 23. Here, examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine, when a voltage is applied via the first electrode 21 and the second electrode 24. Here, the light-emitting layer 3 is formed of a material having high luminous efficiency. Moreover, examples of materials constituting the light-emitting layer 3 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, tris-styrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 has a function of facilitating migration of electrons to the light-emitting layer 3 efficiently. Here, examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 has a function of reducing an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode electrode buffer layer. Here, examples of materials constituting the electron injection layer 5 include inorganic alkaline compounds, such as lithium fluoride (LiF), magnesium fluoride (MgF$_2$), calcium fluoride (CaF$_2$), strontium fluoride (SrF$_2$), and barium fluoride (BaF$_2$), aluminum oxide (Al$_2$O$_3$), and strontium oxide (SrO).

As illustrated in FIG. 3, the second electrode 24 is provided to cover the organic EL layer 23 of each of the subpixels P and the edge cover 22. In addition, the second electrode 24 has a function of injecting electrons into the organic EL layer 23. In addition, the second electrode 24 is preferably formed of a material with a low work function to improve the efficiency of electron injection into the organic EL layer 23. Here, examples of materials constituting the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may also be formed of an alloy such as magnesium (Mg)/copper (Cu), magnesium (Mg)/silver (Ag), sodium (Na)/potassium (K), astatine (At)/astatine oxide (AtO$_2$), lithium (Li)/aluminum (Al), lithium (Li)/calcium (Ca)/aluminum (Al), and lithium fluoride (LiF)/calcium (Ca)/aluminum (Al), for example. In addition, the second electrode 24 may be formed of electrically conductive oxide, for example, tin oxide (SnO), zinc oxide (ZnO), indium tin oxide (ITO), indium zinc oxide (IZO), or the like. In addition, the second electrode 24 may be formed by layering a plurality of layers formed of any of the materials described above. Note that examples of materials having a low work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 35 is provided on the organic EL element layer 30 to cover each of the organic EL elements 25. Here, as illustrated in FIG. 3, the sealing film 35 includes a first inorganic sealing film 31 provided to cover the second electrode 24, an organic sealing film 32 provided on the first inorganic sealing film 31, and a second inorganic sealing film 33 provided to cover the organic sealing film 32, and has a function of protecting the organic EL layer 23 from moisture, oxygen, and the like. Here, the first inorganic sealing film 31 and the second inorganic sealing film 33 are formed of an inorganic material such as, for example, silicon oxide (SiO$_2$), aluminum oxide (Al$_2$O$_3$), silicon nitride (SiN$_x$ (where x is a positive number)) such as trisilicon tetranitride (Si$_3$N$_4$), or silicon carbonitride (SiCN). The organic sealing film 32 is formed of an organic material such as an acrylic resin, a polyurea resin, a parylene resin, a polyimide resin, or a polyamide resin.

As illustrated in FIGS. 6 and 7, the first test portion Ra includes a first test semiconductor layer 12*c* provided on the base coat film 11, the gate insulating film 13, the first interlayer insulating film 15, and the second interlayer insulating film 17 layered in order on the first test semiconductor layer 12*c*, and a first test first terminal 18*h*, a first test second terminal 18*i*, a first test third terminal 18*j*, and a first test fourth terminal 18*k* provided on the second interlayer insulating film 17. Here, the first test semiconductor layer 12*c* is formed in the same layer and of the same material as that of the semiconductor layers 12*a* and 12*b*. As illustrated in FIG. 6, the first test semiconductor layer 12*c* is formed in a swastika-like shape branching in four directions in a plan view. As illustrated in FIGS. 6 and 7, the first test first terminal 18*h*, the first test second terminal 18*i*, the first test third terminal 18*j*, and the first test fourth terminal 18*k* are electrically connected to branched ends of the first test semiconductor layer 12*c* via contact holes Ch, Ci, Cj, and Ck, respectively, formed in the layered film of the gate insulating film 13, the first interlayer insulating film 15, and the second interlayer insulating film 17. Further, using the first test first terminal 18*h*, the first test second terminal 18*i*, the first test third terminal 18*j*, and the first test fourth terminal 18*k*, by a four-terminal resistance measurement method, the first test portion Ra can accurately measure the electrical resistance of the first test semiconductor layer 12*c* formed of polysilicon doped with a dopant such as boron, for example. Here, in the first test portion Ra, as illustrated in FIG. 7, hydrogen H generated from the layered film of the gate insulating film 13, the first interlayer insulating film 15, and the second interlayer insulating film 17 enters an Si film of the first test semiconductor layer 12*c*, the dangling bond present in the Si film is hydrogen-substituted and the defects in the Si film are reduced. Thus, the electrical resistance of the first test semiconductor layer 12*c* becomes relatively low.

As illustrated in FIGS. 8 and 9, the second test portion Rb includes a second test semiconductor layer 12*d* provided on the base coat film 11, the gate insulating film 13, the first interlayer insulating film 15, and the second interlayer insulating film 17 layered in order on the second test semiconductor layer 12*d*, and a second test first terminal 18*v*, a second test second terminal 18*w*, a second test third terminal 18*x*, and a second test fourth terminal 18*y* provided on the second interlayer insulating film 17. Here, the second test semiconductor layer 12*d* is formed in the same layer and of the same material as that of the semiconductor layers 12*a* and 12*b*. Further, as illustrated in FIG. 8, the second test semiconductor layer 12*d* is formed in a swastika-like shape branching in four directions in a plan view. As illustrated in FIGS. 8 and 9, the second test first terminal 18*v*, the second test second terminal 18*w*, the second test third terminal 18*x*, and the second test fourth terminal 18*y* are electrically connected to branched ends of the second test semiconductor layer 12*d* via contact holes Cv, Cw, Cx, and Cy, respectively, formed in the layered film of the gate insulating film 13, the first interlayer insulating film 15, and the second interlayer insulating film 17. In addition, as illustrated in FIGS. 8 and 9, the layered film of the gate insulating film 13, the first interlayer insulating film 15, and the second interlayer insulating film 17 in the second test portion Rb is provided with an opening M extending through the layered film of the gate insulating film 13, the first interlayer insulating film 15, and the second interlayer insulating film 17 in all regions between the second test first terminal 18*v*, the second test second terminal 18*w*, the second test third terminal 18*x*, and the second test fourth terminal 18*y*. Further, using the second test first terminal 18*v*, the second test second terminal 18*w*, the second test third terminal 18*x*, and the second test fourth terminal 18*y*, by a four-terminal resistance measurement method, the second test portion Rb can accurately measure the electrical resistance of the second test semiconductor layer 12*d* formed of polysilicon doped with dopant such as boron, for example. Here, in the second test portion Rb, as illustrated in FIG. 9, since the hydrogen H generated from the layered film of the gate insulating film 13, the first interlayer insulating film 15, and the second interlayer insulating film 17 is discharged from the opening M, the dangling bond present in the Si film of the second test semiconductor layer 12*d* is hardly hydrogen-substituted and reduction of defects in the Si film is suppressed. Thus, the electrical resistance of the second test semiconductor layer 12*d* becomes relatively high.

Note that in the present embodiment, the opening M extending through the layered film of the gate insulating film 13, the first interlayer insulating film 15, and the second interlayer insulating film 17 is illustrated in a cross-sectional view, but the opening M may be provided to open upward without extending through the layered film of the gate insulating film 13, the first interlayer insulating film 15, and the second interlayer insulating film 17. In addition, in the present embodiment, the opening M provided in all regions between the second test first terminal 18*v*, the second test second terminal 18*w*, the second test third terminal 18*x*, and the second test fourth terminal 18*y* is illustrated in a plan view, but the opening M may be provided in a dot shape in a part of a region between at least one of the second test first terminal 18*v*, the second test second terminal 18*w*, the second test third terminal 18*x*, and the second test fourth terminal 18*y*.

The above-described organic EL display device 50*a*, in each of the subpixels P, inputs a gate signal to the first TFT 9*a* via the gate line 14 to turn on the first TFT 9*a*, writes a voltage corresponding to a source signal to the gate electrode 14*b* and the capacitor 9*c* of the second TFT 9*b* via the source line 18*f*, and supplies the organic EL layer 23 with a current from the power source line 18*g* defined on the basis of the gate voltage of the second TFT 9*b*, whereby the light-emitting layer 3 of the organic EL layer 23 emits light to display an image. Note that in the organic EL display device 50*a*, even when the first TFT 9*a* is turned off, the gate voltage of the second TFT 9*b* is held by the capacitor 9*c*. Thus, the light emission by the light-emitting layer 3 is maintained until the gate signal of the next frame is input. The organic EL display device 50*a* manages the characteristics of the first TFT 9*a* and the second TFT 9*b* of each of the subpixels P by measuring the electrical resistance of the first test semiconductor layer 12*c* of the first test portion Ra and the electrical resistance of the second test semiconductor layer 12*d* of the second test portion Rb provided in the frame region F in the process test in the manufacturing process to be described later.

Next, a method for manufacturing the organic EL display device 50*a* according to the present embodiment will be described. Note that the method for manufacturing the organic EL display device 50*a* according to the present embodiment includes a TFT layer forming step, an organic EL element layer forming step, and a sealing film forming step.

TFT Layer Forming Step

First, for example, a non-photosensitive polyimide resin (about 6 μm in thickness) is applied to a glass substrate, and then a coating film thereof is pre-baked and post-baked to form the resin substrate layer 10.

Subsequently, the base coat film 11 is formed by forming a silicon oxide film (about 500 nm in thickness) and a silicon nitride film (about 100 nm in thickness) in order, by, for example, a plasma chemical vapor deposition (CVD) method, onto the substrate surface on which the resin substrate layer 10 is formed.

Thereafter, for example, an amorphous silicon film (about 50 nm in thickness) is formed, by a plasma CVD method, on the substrate surface on which the base coat film 11 is formed, the amorphous silicon film is crystallized by laser annealing or the like to form a polysilicon semiconductor film, and then the semiconductor film is subjected to patterning to form the semiconductor layers 12*a* and 12*b*, the first test semiconductor layer 12*c*, and the second test semiconductor layer 12*d* (semiconductor layer forming step).

Furthermore, an inorganic insulating film (about 100 nm in thickness) such as a silicon oxide film is formed, by, for example, a plasma CVD method, on the substrate surface on which the semiconductor layer 12*a* and others are formed, and the gate insulating film 13 is formed to cover the semiconductor layer 12*a* and others (gate insulating film forming step).

Subsequently, a molybdenum film (about 250 nm in thickness) is formed, by, for example, a sputtering method, on the substrate surface on which the gate insulating film 13 is formed. Then, the molybdenum film is subjected to patterning to form a first wiring line layer including, for example, the gate line 14 and the gate electrodes 14*a* and 14*b*.

Thereafter, with the gate electrodes 14*a* and 14*b* as masks, a part of the semiconductor layers 12*a* and 12*b* is made conductive and the first test semiconductor layer 12*c* and the second test semiconductor layer 12*d* are made conductive by doping dopant ions such as boron, for example (doping step).

Furthermore, a silicon nitride film (about 100 nm in thickness) is formed, by, for example, a plasma CVD method, on the substrate surface on which at least a part of the semiconductor layer 12a and others is made conductive, thereby forming the first interlayer insulating film 15 (interlayer insulating film forming step).

Then, the substrate on which the first interlayer insulating film 15 is formed is subjected to heat treatment at about 400° C. (first annealing step).

Subsequently, a molybdenum film (about 250 nm in thickness) is formed by, for example, a sputtering method, on the heat-treated substrate surface, and then the molybdenum film is subjected to patterning to form the upper conductive layer 16.

Furthermore, a silicon oxide film (about 300 nm in thickness) and a silicon nitride film (about 200 nm in thickness) are formed in order, by, for example, a plasma CVD method, on the substrate surface on which the upper conductive layer 16 is formed, thereby forming the second interlayer insulating film 17.

Thereafter, the gate insulating film 13, the first interlayer insulating film 15, and the second interlayer insulating film 17 are subjected to patterning, thereby forming the contact holes Ch, Ci, Cj, Ck, Cv, Cw, Cx, Cy and the like, and the opening M (layered film patterning step).

Then, the substrate on which the contact holes and the opening M are formed is subjected to heat treatment at about 400° C. (second annealing step). Note that the temperature of the heat treatment performed in the second annealing step may be lower than the temperature of the heat treatment performed in the first annealing step.

Thereafter, a titanium film (about 50 nm in thickness), an aluminum film (about 600 nm in thickness), and a titanium film (about 50 nm in thickness) are formed in order, by, for example, a sputtering method, on the heat-treated substrate surface, and then the metal layered film of these films is subjected to patterning to form a third wiring line layer of the source electrodes 18a and 18c, the drain electrodes 18b and 18d, the source line 18f, the power source line 18g, the first test first terminal 18h, the first test second terminal 18i, the first test third terminal 18j, the first test fourth terminal 18k, the second test first terminal 18v, the second test second terminal 18w, the second test third terminal 18x, and the second test fourth terminal 18y. Due to this, the first TFT 9a, the second TFT 9b, the first test portion Ra, and the second test portion Rb are formed, and after the present step, as required, for example, a probe pin of an electrical resistance measurement device is brought into contact with the first test first terminal 18h, the first test second terminal 18i, the first test third terminal 18j, and the first test fourth terminal 18k of the first test portion Ra, and the second test first terminal 18v, the second test second terminal 18w, the second test third terminal 18x, and the second test fourth terminal 18y of the second test portion Rb to measure the electrical resistances of the first test semiconductor layer 12c of the first test portion Ra and the second test semiconductor layer 12d of the second test portion Rb, respectively. A difference between these electrical resistances is detected, whereby the characteristics of the first TFT 9a and the second TFT 9b can be managed. Note that, while it is possible to detect a difference between the electrical resistance value of the first test semiconductor layer 12c of the first test portion Ra and the electrical resistance value of the second test semiconductor layer 12d of the second test portion Rb according to the method for manufacturing (of the example) of the present embodiment, it is not possible to detect the difference between the electrical resistance value of a first test semiconductor layer (12c) of a first test portion (Ra) and the electrical resistance value of a second test semiconductor layer (12d) of a second test portion (Rb) according to a method for manufacturing of a comparative example to be described later.

Finally, a photosensitive polyimide resin (about 2.5 μm in thickness) is applied, by, for example, a spin coating method or a slit coating method, onto the substrate surface on which the third wiring line layer is formed, and then the coating film is pre-baked, exposed, developed, and post-baked to form the flattening film 19.

In the above-described manner, the TFT layer 20 can be formed. Here, in the example in which the gate insulating film forming step, the interlayer insulating film forming step, the first annealing step, the layered film patterning step, and the second annealing step are performed in this order, the waveforms of the current-voltage characteristics of the first TFT 9a and the second TFT 9b formed on the TFT layer 20 have a gentle slope and a relatively large S value, as shown in FIG. 10. On the other hand, in the comparative example in which the gate insulating film forming step, the first annealing step, the interlayer insulating film forming step, the second annealing step, and the layered film patterning step are performed in this order, the waveforms of the current-voltage characteristics of a first TFT (9a) and a second TFT (9b) have a steep slope and a relatively small S value, as shown in FIG. 11.

Organic EL Element Layer Forming Step

On the flattening film 19 of the TFT layer 20 formed in the TFT layer forming step, the first electrode 21, the edge cover 22, the organic EL layer 23 (the hole injection layer 1, the hole transport layer 2, the light-emitting layer 3, the electron transport layer 4, and the electron injection layer 5), and the second electrode 24 are formed using a known method, thereby forming the organic EL element 25 and forming the organic EL element layer 30.

Sealing Film Forming Step

On the organic EL element layer 30 formed in the organic EL element layer forming step, an inorganic insulating film such as a silicon nitride film, a silicon oxide film, or a silicon oxynitride film is formed by a plasma CVD method using a mask to cover each of the organic EL elements 25, thereby forming the first inorganic sealing film 31.

Subsequently, an organic resin material such as an acrylic resin is formed on the first inorganic sealing film 31 by, for example, an inkjet method to form the organic sealing film 32.

Thereafter, an inorganic insulating film such as a silicon nitride film, a silicon oxide film, or a silicon oxynitride film is formed by a plasma CVD method using a mask to cover the organic sealing film 32 to form the second inorganic sealing film 33, thereby forming the sealing film 35.

Finally, after a protective sheet (not illustrated) is applied to the substrate surface on which the sealing film 35 is formed, the glass substrate is peeled off from the lower face of the resin substrate layer 10 by irradiating laser light from the glass substrate side of the resin substrate layer 10, and further, a protective sheet (not illustrated) is applied to the lower face of the resin substrate layer 10 from which the glass substrate has been peeled off.

Thus, the organic EL display device 50a of the present embodiment can be manufactured as described above.

As described above, according to the organic EL display device 50a and the method for manufacturing the same of the present embodiment, the test portion R provided in the frame region F includes the first test portion Ra and the second test portion Rb provided adjacent to each other. Here, in the first test portion Ra, the hydrogen H generated from the layered film of the gate insulating film 13, the first interlayer insulating film 15, and the second interlayer insulating film 17 enters an Si film of the first test semiconductor layer 12*c*, the dangling bond present in the Si film is hydrogen-substituted and the defects in the Si film are reduced. Thus, the electrical resistance of the first test semiconductor layer 12*c* becomes relatively low. In the second test portion Rb, the layered film of the gate insulating film 13, the first interlayer insulating film 15, and the second interlayer insulating film 17 is provided with the opening M open upward between at least one of the second test first terminal 18*v*, the second test second terminal 18*w*, the second test third terminal 18*x*, and the second test fourth terminal 18*y*. Here, in the second test portion Rb, since the hydrogen H generated from the layered film of the gate insulating film 13, the first interlayer insulating film 15, and the second interlayer insulating film 17 is discharged from the opening M, the dangling bond present in the Si film of the second test semiconductor layer 12*d* is hardly hydrogen-substituted and reduction of defects in the Si film is suppressed. Thus, the electrical resistance of the second test semiconductor layer 12*d* becomes relatively high. Due to this, the difference between the electrical resistance of the first test semiconductor layer 12*c* of the first test portion Ra and the electrical resistance of the second test semiconductor layer 12*d* of the second test portion Rb can be reliably detected. As a result, hydrogen desorption in the Si film of the semiconductor layer 12*a* of the first TFT 9*a* and the semiconductor layer 12*b* of the second TFT 9*b* of each of the subpixels P is recognized, and the characteristics of the first TFT 9*a* and the second TFT 9*b* of the TFT layer 20 can be reliably managed by the process test. Furthermore, by detecting the difference between the electrical resistance of the first test semiconductor layer 12*c* of the first test portion Ra and the electrical resistance of the second test semiconductor layer 12*d* of the second test portion Rb, it is possible to estimate manufacturing steps performed when the first organic EL display device 50*a* is manufactured, that is, a manufacturing process performed in which the gate insulating film forming step, the interlayer insulating film forming step, the first annealing step, the layered film patterning step, and the second annealing step are performed sequentially.

In addition, according to the organic EL display device 50*a* and the method for manufacturing the same of the present embodiment, in the second test portion Rb, the layered film of the gate insulating film 13, the first interlayer insulating film 15, and the second interlayer insulating film 17 is provided with the opening M extending through the layered film of the gate insulating film 13, the first interlayer insulating film 15, and the second interlayer insulating film 17 in all regions between the second test first terminal 18*v*, the second test second terminal 18*w*, the second test third terminal 18*x*, and the second test fourth terminal 18*y*. Therefore, since the hydrogen H generated from the layered film of the gate insulating film 13, the first interlayer insulating film 15, and the second interlayer insulating film 17 is further discharged from the opening M, the dangling bond present in the Si film of the second test semiconductor layer 12*d* is further hardly hydrogen-substituted, reduction of defects in the Si film is suppressed, and therefore the electrical resistance of the second test semiconductor layer 12*d* becomes further relatively high. Due to this, it is possible to more reliably detect the difference between the electrical resistance of the first test semiconductor layer 12*c* of the first test portion Ra and the electrical resistance of the second test semiconductor layer 12*d* of the second test portion Rb.

In addition, according to the organic EL display device 50*a* and the method for manufacturing the same of the present embodiment, since the gate insulating film forming step, the interlayer insulating film forming step, the first annealing step, the layered film patterning step, and the second annealing step are performed sequentially in the TFT layer forming step, in the first annealing step, a defect generated in the doping step in the Si film of the semiconductor layers 12*a* and 12*b* can be repaired, and the dangling bond present in the Si film can be hydrogen-substituted. Then, in the second annealing step, hydrogen desorption in the Si films of the semiconductor layers 12*a* and 12*b* can be performed. Here, since the hydrogen desorption in the second annealing step is uniformly performed on the substrate surface, variation in the S value can be reduced.

In addition, according to the organic EL display device 50*a* and the method for manufacturing the same of the present embodiment, when the temperature of the heat treatment performed in the second annealing step is made lower than the temperature of the heat treatment performed in the first annealing step, it is possible to suppress an excessive S value.

Second Embodiment

Figure 12:
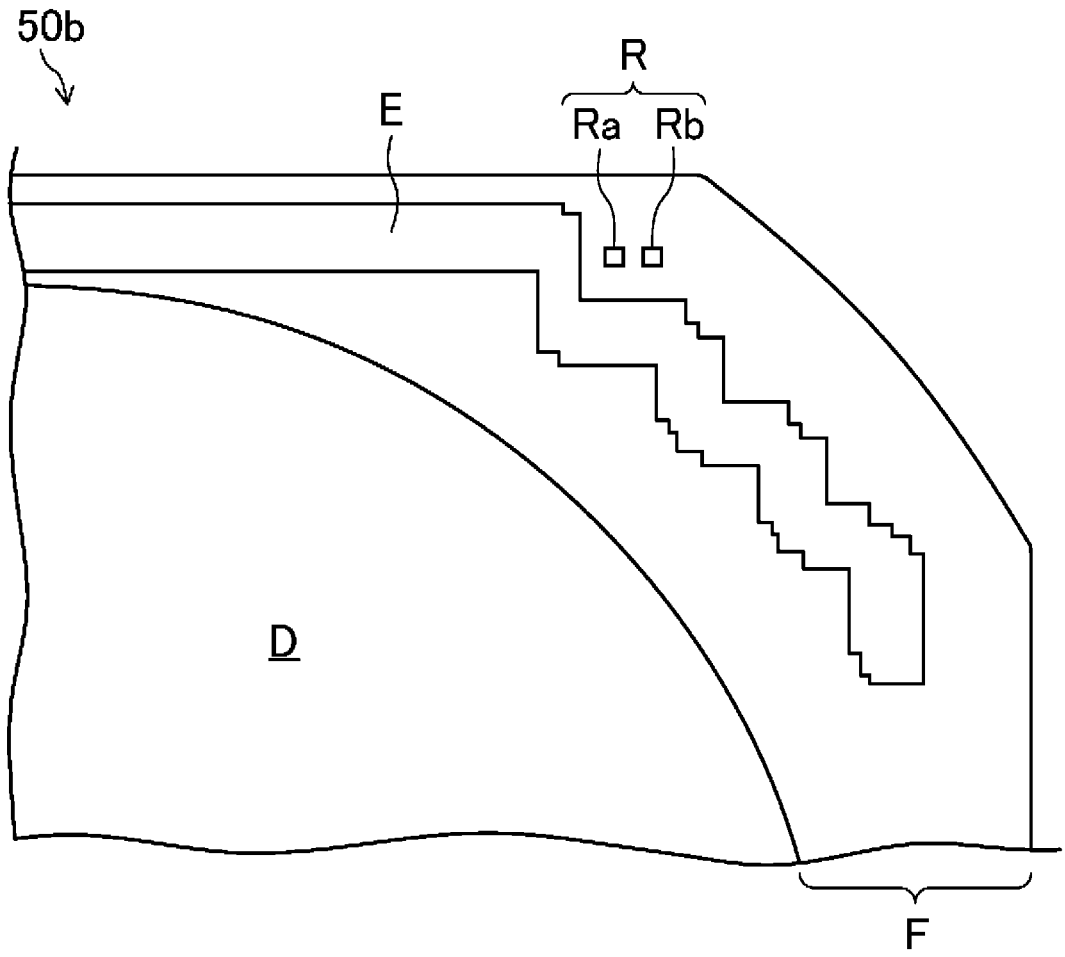
FIG. 12 is a plan view illustrating a schematic configuration of an organic EL display device according to a second embodiment of the disclosure.

FIG. 12 illustrates a second embodiment of a display device and a method for manufacturing the same according to the disclosure. Here, FIG. 12 is a plan view illustrating a schematic configuration of an organic EL display device 50*b* of the present embodiment. Note that in the following embodiments, the same parts as those in FIGS. 1 to 11 are denoted by the same reference signs, and detailed description thereof will be omitted.

In the first embodiment, the organic EL display device 50*a* in which the test portion R is provided in the part corresponding to the corner of the display region D in the frame region F is taken as an example, but in the present embodiment, the organic EL display device 50*b* in which the test portion R is provided in the vicinity of a peripheral circuit E of the frame region F is exemplified.

Similarly to the organic EL display device 50*a* of the first embodiment described above, the organic EL display device 50*b* is provided with the display region D and the frame region F provided around the display region D.

As illustrated in FIG. 2, the display region D is provided in a substantially rectangular shape having arc-shaped corners.

The frame region F is monolithically provided with the peripheral circuit E such as a gate driver (gate drive circuit) or an emission driver. Here, for example, the peripheral circuit E is provided along two opposing sides around the display region D formed in a substantially rectangular shape having arc-shaped corners, and is provided to be bent stepwise in a plan view along the arc-shaped part, as illustrated in FIG. 12, in the arc-shaped part at the end portions of those two sides. As illustrated in FIG. 12, the test portion R including the first test portion Ra and the second test portion Rb is provided in a valley part outside the bent portion of the peripheral circuit E.

Similarly to the organic EL display device 50*a* of the first embodiment described above, the organic EL display device 50*b* includes, in the display region D, the resin substrate layer 10, the TFT layer 20 provided on the resin substrate layer 10, the organic EL element layer 30 provided on the TFT layer 20, and the sealing film 35 provided on the organic EL element layer 30.

Similarly to the organic EL display device 50*a* of the first embodiment, the organic EL display device 50*b* described above is flexible and is configured to display an image by causing the light-emitting layer 3 of the organic EL layer 23 to emit light as required, via the first TFT 9*a* and the second TFT 9*b* in each of the subpixels P. Similarly to the organic EL display device 50*a* of the first embodiment described above, the organic EL display device 50*b* manages the characteristics of the first TFT 9*a* and the second TFT 9*b* of each of the subpixels P by measuring the electrical resistance of the first test semiconductor layer 12*c* of the first test portion Ra and the electrical resistance of the second test semiconductor layer 12*d* of the second test portion Rb provided in the frame region F.

The organic EL display device 50*b* of the present embodiment can be manufactured by changing the position where the test portion R is formed in the method for manufacturing the organic EL display device 50*a* of the first embodiment.

As described above, according to the organic EL display device 50*b* and the method for manufacturing the same of the present embodiment, the test portion R provided in the frame region F includes the first test portion Ra and the second test portion Rb provided adjacent to each other. Here, in the first test portion Ra, the hydrogen H generated from the layered film of the gate insulating film 13, the first interlayer insulating film 15, and the second interlayer insulating film 17 enters the Si film of the first test semiconductor layer 12*c*, the dangling bond present in the Si film is hydrogen-substituted and the defects in the Si film are reduced. Thus, the electrical resistance of the first test semiconductor layer 12*c* becomes relatively low. In the second test portion Rb, the layered film of the gate insulating film 13, the first interlayer insulating film 15, and the second interlayer insulating film 17 is provided with the opening M open upward between at least one of the second test first terminal 18*v*, the second test second terminal 18*w*, the second test third terminal 18*x*, and the second test fourth terminal 18*y*. Here, in the second test portion Rb, since the hydrogen H generated from the layered film of the gate insulating film 13, the first interlayer insulating film 15, and the second interlayer insulating film 17 is discharged from the opening M, the dangling bond present in the Si film of the second test semiconductor layer 12*d* is hardly hydrogen-substituted and reduction of defects in the Si film is suppressed. Thus, the electrical resistance of the second test semiconductor layer 12*d* becomes relatively high. Due to this, the difference between the electrical resistance of the first test semiconductor layer 12*c* of the first test portion Ra and the electrical resistance of the second test semiconductor layer 12*d* of the second test portion Rb can be reliably detected. As a result, hydrogen desorption in the Si film of the semiconductor layer 12*a* of the first TFT 9*a* and the semiconductor layer 12*b* of the second TFT 9*b* of each of the subpixels P is recognized, and the characteristics of the first TFT 9*a* and the second TFT 9*b* of the TFT layer 20 can be reliably managed by the process test. Furthermore, by detecting the difference between the electrical resistance of the first test semiconductor layer 12*c* of the first test portion Ra and the electrical resistance of the second test semiconductor layer 12*d* of the second test portion Rb, it is possible to estimate manufacturing steps performed when the first organic EL display device 50*b* is manufactured, that is, a manufacturing process in which the gate insulating film forming step, the interlayer insulating film forming step, the first annealing step, the layered film patterning step, and the second annealing step are performed sequentially.

In addition, according to the organic EL display device 50*b* and the method for manufacturing the same of the present embodiment, since the test portion R is provided in the vicinity of the peripheral circuit E in which the TFT is formed in the frame region F, the density of the line pattern around the test portion R approaches the density of the line pattern of each of the subpixels P, and the characteristics of the first TFT 9*a* and the second TFT 9*b* of the TFT layer 20 can be more reliably managed by the process test.

Other Embodiments

In each of the embodiments described above, the organic EL layer having a five-layer structure including the hole injection layer, the hole transport layer, the light-emitting layer, the electron transport layer, and the electron injection layer is exemplified, but the organic EL layer may have a three-layer structure including a hole injection-cum-transport layer, a light-emitting layer, and an electron transport-cum-injection layer, for example.

In each of the embodiments described above, the organic EL display device including the first electrode as an anode and the second electrode as a cathode is exemplified. The disclosure is also applicable to an organic EL display device in which the layered structure of the organic EL layer is reversed with the first electrode being a cathode and the second electrode being an anode.

In each of the embodiments described above, the organic EL display device in which the electrode of the TFT connected to the first electrode serves as the drain electrode is exemplified. However, the disclosure is also applicable to an organic EL display device in which the electrode of the TFT connected to the first electrode is referred to as the source electrode.

In each of the embodiments described above, the organic EL display device is exemplified as a display device. The disclosure can also be applied to a display device including a plurality of light-emitting elements driven by a current, for example, to a display device including quantum dot light-emitting diodes (QLEDs), which are a light-emitting element using a quantum dot-containing layer.

INDUSTRIAL APPLICABILITY

As described above, the disclosure is useful for a flexible display device.

The invention claimed is:

1. A display device comprising:
   a base substrate;
   a thin film transistor layer provided on the base substrate and including a semiconductor layer, a gate insulating film, a first wiring line layer, an interlayer insulating film, and a second wiring line layer layered in this order; and
   a light-emitting element layer provided on the thin film transistor layer and including a plurality of light-emitting elements arrayed corresponding to a plurality of subpixels constituting a display region,
   wherein a frame region is provided around the display region,
   a test portion is provided in the frame region,
   the test portion includes a first test portion and a second test portion provided adjacent to each other,
   the first test portion includes a first test semiconductor layer formed of a same material as a material of the semiconductor layer in a same layer, the gate insulating film and the interlayer insulating film provided covering the first test semiconductor layer, and a first test first terminal, a first test second terminal, a first test third terminal, and a first test fourth terminal provided on the interlayer insulating film and electrically connected to the first test semiconductor layer via respective contact holes formed in a layered film of the gate insulating film and the interlayer insulating film, the second test portion includes a second test semiconductor layer formed of a same material as a material of the semiconductor layer in a same layer, the gate insulating film and the interlayer insulating film provided covering the second test semiconductor layer, and a second test first terminal, a second test second terminal, a second test third terminal, and a second test fourth terminal provided on the interlayer insulating film and electrically connected to the second test semiconductor layer via respective contact holes formed in a layered film of the gate insulating film and the interlayer insulating film, and the layered film of the gate insulating film and the interlayer insulating film in the second test portion is provided with an opening open upward between at least one of the second test first terminal, the second test second terminal, the second test third terminal, and the second test fourth terminal.

2. The display device according to claim 1,
wherein the opening is provided extending through a layered film of the gate insulating film and the interlayer insulating film in the second test portion.

3. The display device according to claim 1,
wherein the opening is provided in all regions between the second test first terminal, the second test second terminal, the second test third terminal, and the second test fourth terminal.

4. The display device according to claim 1,
wherein the first test semiconductor layer and the second test semiconductor layer are formed to branch in four directions in a plan view,
the first test first terminal, the first test second terminal, the first test third terminal, and the first test fourth terminal are electrically connected respectively to branched ends of the first test semiconductor layer, and
the second test first terminal, the second test second terminal, the second test third terminal, and the second test fourth terminal are electrically connected respectively to branched ends of the second test semiconductor layer.

5. The display device according to claim 1,
wherein a thin film transistor provided on the thin film transistor layer is a p-type thin film transistor.

6. The display device according to claim 1,
wherein a plurality of the test portions are provided in the frame region.

7. The display device according to claim 6,
wherein the display region is provided in a rectangular shape, and
the plurality of test portions are provided at parts corresponding to four corners of the display region in the frame region.

8. The display device according to claim 1,
wherein the display region is provided in a substantially rectangular shape having arc-shaped corners,
the frame region is provided with a peripheral circuit around the display region,
in an arc-shaped part around the display region, the peripheral circuit is provided to bend stepwise in a plan view along the arc-shaped part, and
the test portion is provided in a valley part outside a bent portion of the peripheral circuit.

9. The display device according to claim 8,
wherein the peripheral circuit is a gate drive circuit.

10. The display device according to claim 1,
wherein each of the light-emitting elements is an organic electroluminescence element.

11. A method for manufacturing the display device described in claim 1, the method comprising:
performing semiconductor layer formation of forming the first test semiconductor layer and the second test semiconductor layer when forming the semiconductor layer;
performing gate insulating film formation of forming the gate insulating film covering the semiconductor layer, the first test semiconductor layer, and the second test semiconductor layer formed in the semiconductor layer formation;
performing interlayer insulating film formation of forming an interlayer insulating film on the gate insulating film formed in the gate insulating film formation;
performing first annealing of performing heat treatment after the interlayer insulating film formation;
performing layered film patterning of subjecting a layered film of the gate insulating film and the interlayer insulating film to patterning to form the contact holes and the opening after the first annealing; and
performing second annealing of performing heat treatment after the layered film patterning.

12. The method for manufacturing the display device according to claim 11, further comprising:
doping a dopant in the semiconductor layer, the first test semiconductor layer, and the second test semiconductor layer via the gate insulating film between the gate insulating film formation and the interlayer insulating film formation.

13. The method for manufacturing the display device according to claim 11,
wherein a temperature of the heat treatment performed in the second annealing is lower than a temperature of the heat treatment performed in the first annealing.

* * * * *